(12) United States Patent
Shur et al.

(10) Patent No.: US 7,842,933 B2
(45) Date of Patent: Nov. 30, 2010

(54) SYSTEM AND METHOD FOR MEASURING OVERLAY ERRORS

(75) Inventors: Dimitry Shur, Holon (IL); Alexander Kadyshevitch, Moddieen (IL)

(73) Assignee: Applied Materials Israel, Ltd., Rehovot (IL)

( * ) Notice: Subject to any disclaimer, the term of this patent is extended or adjusted under 35 U.S.C. 154(b) by 688 days.

(21) Appl. No.: 10/691,746

(22) Filed: Oct. 22, 2003

(65) Prior Publication Data
US 2005/0089773 A1    Apr. 28, 2005

(51) Int. Cl.
*G21K 5/10* (2006.01)
(52) U.S. Cl. .............. 250/492.1; 250/491.1; 430/22
(58) Field of Classification Search .......... 250/492.1
See application file for complete search history.

(56) References Cited

U.S. PATENT DOCUMENTS

| | | | |
|---|---|---|---|
| 3,849,659 A * | 11/1974 | O'Keeffe ............... 250/492.1 |
| 4,896,036 A | 1/1990 | Rose et al. |
| 4,926,054 A | 5/1990 | Frosien |
| 5,659,172 A | 8/1997 | Wagner et al. |
| 5,895,917 A | 4/1999 | Ueda et al. |
| 5,900,629 A | 5/1999 | Todokoro et al. |
| 5,939,720 A | 8/1999 | Todokoro |
| 5,952,241 A * | 9/1999 | Baker et al. ............. 438/691 |
| 6,037,589 A | 3/2000 | Yonezawa et al. |
| 6,064,486 A * | 5/2000 | Chen et al. ............. 356/401 |
| 6,066,853 A | 5/2000 | Nakasuji |
| 6,172,365 B1 * | 1/2001 | Hiroi et al. ............. 250/310 |
| 6,184,526 B1 | 2/2001 | Kohama et al. |
| 6,194,729 B1 | 2/2001 | Weimer |
| 6,232,601 B1 | 5/2001 | Schmitt et al. |
| 6,287,734 B2 * | 9/2001 | Imai ............. 430/22 |
| 6,291,870 B1 * | 9/2001 | Kawashima et al. ........ 257/510 |
| 6,365,897 B1 | 4/2002 | Hamashima et al. |
| 6,407,388 B1 | 6/2002 | Frosien |
| 6,407,396 B1 | 6/2002 | Mih et al. |

(Continued)

FOREIGN PATENT DOCUMENTS

WO    99/46797    9/1999

(Continued)

OTHER PUBLICATIONS

Frosien, J. "Compound Magnetic and electrostatic Lenses for Low-Voltage Applications", Journal of Vacuum Science and Technology: Part B, American Institute of Physics, New York US, vol. 7, No. 6, 18XP000117179, ISSN: 1071-1023, Nov. 1, 1989), 1871-1877.

(Continued)

*Primary Examiner*—Phillip A Johnston
(74) *Attorney, Agent, or Firm*—SNR Denton US LLP (57) ABSTRACT

A system and method for detecting overlay errors, the method includes (i) directing a primary electron beam to interact with an inspected object; whereas the inspected object comprises a first feature formed on a first layer of the inspected object and a second feature formed on a second layer of the object, wherein the second feature is buried under the first layer and wherein the second feature affects a shape of an area of the first layer; (ii) detecting electrons reflected or scattered from the area of the first layer; and (iii) receiving detection signals from at least one detector and determining overlay errors.

8 Claims, 7 Drawing Sheets

U.S. PATENT DOCUMENTS

| | | | |
|---|---|---|---|
| 6,463,184 B1 | 10/2002 | Gould et al. | |
| 6,489,068 B1 | 12/2002 | Kye | |
| 6,498,068 B1 | 12/2002 | Ueda et al. | |
| 6,501,077 B1 * | 12/2002 | Sawahata et al. | 250/310 |
| 6,555,819 B1 | 4/2003 | Suzuki et al. | |
| 6,589,385 B2 | 7/2003 | Minami et al. | |
| 6,590,210 B1 * | 7/2003 | Essers | 850/9 |
| 6,674,075 B2 | 1/2004 | Petrov et al. | |
| 6,778,275 B2 * | 8/2004 | Bowes | 356/400 |
| 2002/0185599 A1 | 12/2002 | Kimura et al. | |

FOREIGN PATENT DOCUMENTS

| | | |
|---|---|---|
| WO | 01/45136 A1 | 6/2001 |
| WO | 02/37523 A2 | 5/2002 |

OTHER PUBLICATIONS

Applied Materials Israel, Ltd., International Search Report and Written Opinion, PCT/US2004/012468 filed Apr. 22, 2004, ISA/EP, mailed Oct. 29, 2004, 18 pp.

Applied Materials, Inc.; PCT/US03/15018 filed May 12, 2003; International Search Report, ISA/EP, mailed Jan. 26, 2004, 9 pp.

Patent Abstracts of Japan, vol. 1998, No. 13, Nov. 30, 1998- & JP 10 214586 A (Horon: KK), Aug. 11, 1998, abstract; figures 1, 2.

Patent Abstracts of Japan, vol. 1999, No. 11, Sep. 30, 1999, JP 11 162384 1 pg.

Patent Abstracts of Japan, vol. 01, No. 385 (P-1094), Aug. 20, 1990- & JP 02 145947 A (Shimadzu Corp), Jun. 5, 1990, abstract; figure 1.

* cited by examiner

```
┌─────────────────────────────────────┐
│  directing a primary electron beam to interact
│  with a first feature and a second feature of an
│  inspected object. The first feature is formed on a
│  first layer of the inspected object and the second
│  feature formed on a second layer of the object.
│  The second feature is buried under the first
│                  layer.
│                   212
└─────────────────────────────────────┘
                    │
┌─────────────────────────────────────┐
│  directing electrons reflected or scattered
│  from the first and second features towards at
│              least one detector
│                   214
└─────────────────────────────────────┘
                    │
┌─────────────────────────────────────┐
│  receiving detection signals from at least one
│   detector and determining overlay errors
│                   216
└─────────────────────────────────────┘
```

SYSTEM AND METHOD FOR MEASURING OVERLAY ERRORS

FIELD OF THE INVENTION

The invention relates to systems and methods for measuring overlay errors on objects such as wafers, reticles and the like, and especially system and methods that use charged particle beams to observe said overlay errors.

BACKGROUND OF THE INVENTION

Overlay Error Measurements

Integrated circuits are very complex devices that include multiple layers. Each layer may include conductive material, isolating material while other layers may include semi-conductive materials. These various materials are arranged in patterns, usually in accordance with the expected functionality of the integrated circuit. The patterns also reflect the manufacturing process of the integrated circuits.

Each layer is formed by a sequence of steps that usually includes depositing a resistive material on a substrate/layer, exposing the resistive material by a photolithographic process, and developing the exposed resistive material to produce a pattern that defines some areas to be later etched.

Ideally, each layer is perfectly aligned to previously existing layer. Typically, the layers are misaligned, thus a misalignment or overlay error exists between each pair of layers.

Various techniques evolved for observing overlay errors, some using optical instruments and some using scanning electron microscopes. U.S. Pat. No. 6,407,396 of Mih et al., U.S. Pat. No. 6,489,068 of Kye, U.S. Pat. No. 6,463,184 of Gould et al., U.S. Pat. No. 6,589,385 of Minami et al, all being incorporated herein by reference, provide a good indication about the state of art overlay error measurement techniques.

Figure 3A:
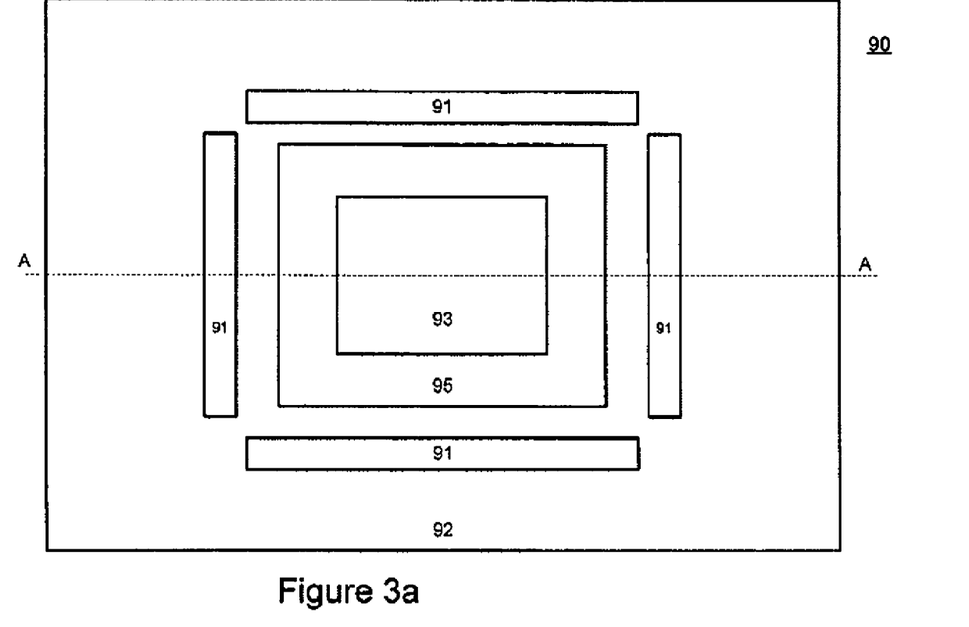
FIGS. 3*a*-3*b* are different views of a prior art overlay measurement target.
Figure 3B:
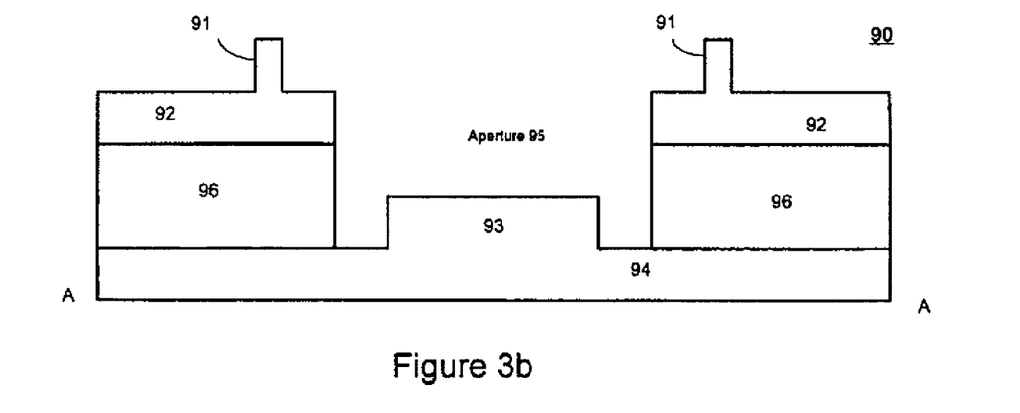

FIGS. 3a and 3b illustrate a commonly used overlay measurement target 90 that facilitates overlay measurements. Target 90 includes a first feature 91 formed in a first layer 92, a second feature 93 formed in a second layer 94 positioned under an aperture 95 that is formed in the first layer 92 and in an intermediate layer 96 positioned between the first and second layers. Both features 91 and 93 are visible to illuminating charged particle beams or optical beams. The formation of apertures is further subjected to inaccuracies and overlay errors and also may change the electrical properties of the integrated circuit.

Optical overlay measurement methods require relatively large targets that may exceed tens of microns. Usually, said overlay targets are positioned at the scribe lines that are positioned between different dices of the wafer.

Due to various reasons, such as manufacturing process fluctuations and inaccuracies, the manufacturing process parameters (and as a result the overlay errors) may differ across the wafer, and especially may differ from scribe lines to the dices and especially to central regions of the dices.

Accordingly, measuring overlay errors at the scribe lines may not reflect the status of overlay errors of the dice.

Due to the large cost of dice estate the amount of large overlay targets is usually limited.

Optical overlay measurements are subjected to various errors such as lens aberrations of the optical system. Mih states that in some cases Atomic Force Microscopy or Scanning Electron Microscopy metrology techniques may be necessary to verify the optical overlay measurement accuracy.

Interaction Between Charged Electron Beam and an Inspected Object

Once an electron beam hits an inspected object various interaction processes occur. A detailed description of these processes can be found at "Scanning electron microscopy", L. Reimer, second edition, 1998, which is incorporated herein by reference.

Figure 1:
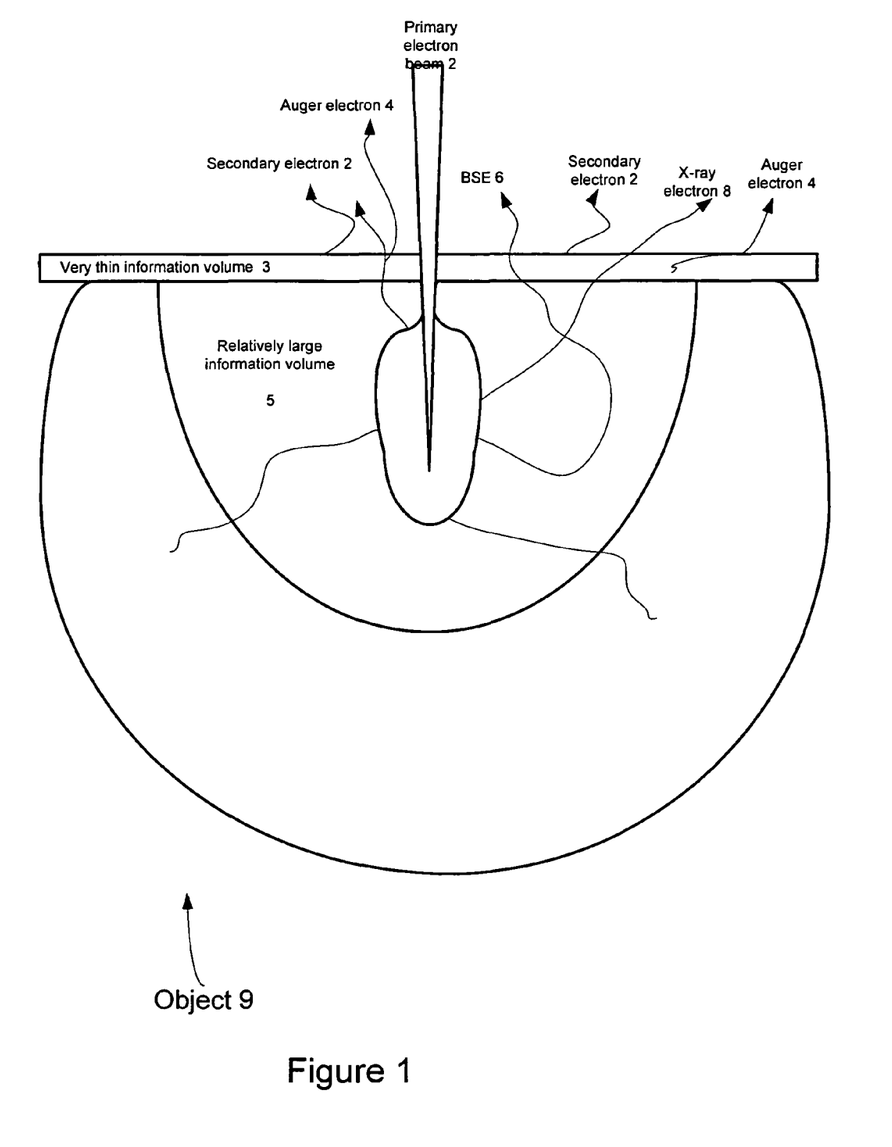
FIG. 1 illustrates various interaction processes and their respective information volumes.

FIG. 1 illustrates the important interaction process and various information volumes. An information volume is a space in which interaction process occur and result in scattering or reflection of electrons that may be eventually detected to provide information about the information volume.

FIG. 1 illustrates the important interaction processes and various information volumes. An information volume is a space in which interaction processes occur and result in scattering or reflection of electrons that may be eventually detected to provide information about the information volume.

Secondary electrons are easy to detect as their trajectory can be relatively easily changed such that they are directed toward a detector. The trajectory of backscattered electrons is relatively straight and is slightly affected by electrostatic fields.

Multi-Perspective Scanning Electron Microscopes

There are various prior art types of multi-perspective scanning electron microscopes.

Figure 2A:
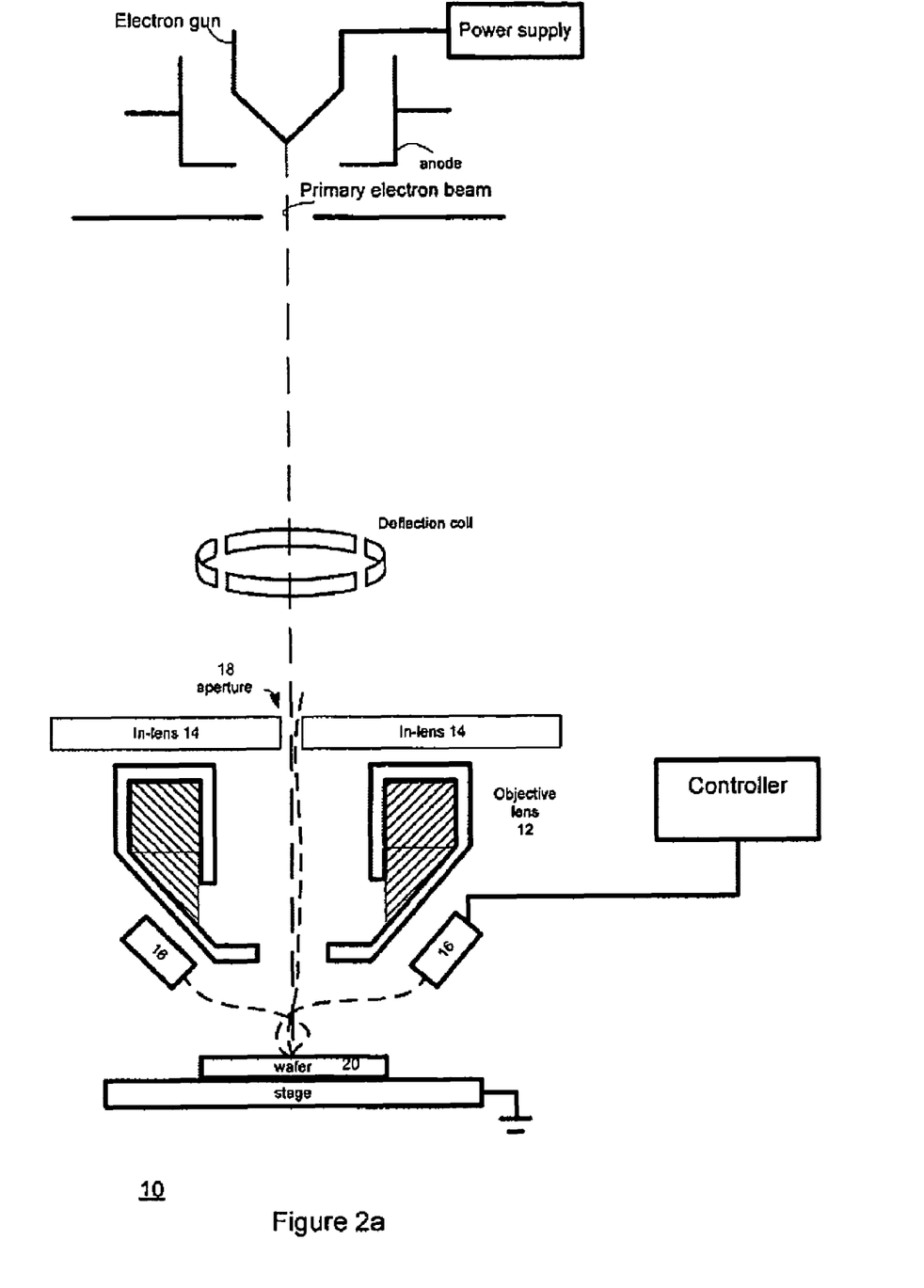
FIG. 2*a* describes a portion of a multi-detector Scanning Electron Microscope.

FIG. 2a illustrates a first type of a multi-perspective SEM 10 that includes multiple detectors. SEM 10 includes an electron gun (not shown) for generating a primary electron beam, as well as multiple control and voltage supply units (not shown), an objective lens 12, in-lens detector 14 and external detectors 16. System 10 also includes deflection coils and a processor (not shown). Such a system is described at U.S. Pat. No. 5,659,172 of Wagner.

In system 10 the primary electron beam is directed through an aperture 18 within the in-lens detector 14 to be focused by the objective lens 12 onto an inspected wafer 20. The primary electron beam interacts with wafer 20 and as a result various types of electrons, such as secondary electrons, back-scattered electrons, Auger electrons and X-ray quanta are reflected or scattered. Secondary electrons can be collected easily and most SEMs mainly detect these secondary electrons.

System 10 is capable of detecting some of the emitted secondary electrons by in-lens detector 14 and by external detectors 16.

Objective lens 12 includes an electrostatic lens and a magnetic lens that introduce an electrostatic field and a magnetic field that leak from the lens towards the wafer. The collection of secondary electrons is highly responsive to the leaked electrostatic field while it hardly influenced by the leaked magnetic field.

The leaked electrostatic field attracts low energy secondary electrons and very low energy secondary electrons into the column. A significant part of the very low energy secondary electrons are directed through the aperture of in-lens detector 14 and are not detected. Low energy secondary electrons are directed towards the in-lens detector 14. High-energy secondary electrons are detected if their initial trajectory is aimed towards one of the detectors.

Effective defect review tool requires both types of detectors in order to capture all types of defects. In-lens detector 14 is usually used for determining a contrast between different materials, and is also useful in voltage contract mode as well as in HAR mode. HAR mode is used to inspect cavities that are characterized by a High Aspect Ratio (in other words—cavities that are narrow and deep). During HAR mode the area that surrounds the cavity is usually charged to allow electrons from the lower portion of the cavity to reach the detector. The In-lens detector 14 is also very sensitive to pattern edges. External detectors 16 are much more sensitive to the topography of the wafer. The external detectors are also less susceptible to wafer charging, which is significant when imaging highly resistive layers.

Another U.S. Pat. No. 6,555,819 of Suzuki et al (which is incorporated herein by reference) describes a multi-detector SEM having magnetic leakage type objective lens where the magnetic field largely influences the trajectory of emitted secondary electrons. This SEM has various disadvantages, such as not being capable of providing tilted images and is not efficient to provide images from holes of high aspect ratio. Suzuki has a reflector that includes an aperture through which the primary electron beam passes, thus reflected electrons may pass through this aperture and remain un-detected.

There is a need to provide a simple system and method that facilitated seamless overlay measurements of different types.

There is a need to provide a system and method for expanding the capabilities of electron beam based overlay measurements.

SUMMARY OF THE INVENTION

Detecting Second Feature by First Layer Topography Detection

The invention provides a system and method for measuring overlay errors in response to a relative displacement between a first feature formed on a first layer of an object and a second feature formed on a second layer of an object. The second feature is buried under the first layer.

According to an embodiment of the invention the second feature affects the shape (topography) of the first layer. Thus, the second feature can be detected in response to interactions with the first layer. This detection requires attracting towards one or more detectors electrons that are scattered or reflected at small angle in relation to the inspected object.

The detection of electrons that are scattered or reflected at relatively small angles (and even at angles the range between few degrees and about eighty degrees) can be achieved by using multiple-detector SEM. According to an embodiment of the invention that SEM may include external as well as internal detectors. The external detectors are more sensitive to the topography of the inspected object as they can detect electrons reflected or scattered at angles that deviate from the normal to the inspected object. According to another embodiment of the invention the multi-detector SEM has a magnetic leakage type objective lens where the magnetic field largely influences the trajectory of emitted secondary electrons. The detectors are all in-lens detectors. According to a further embodiment of the SEM has an electrostatic type objective lens and at least one in-lens detector as well as at least one inner-lens detector.

Detecting Second Feature by Interacting with the Second Feature

According to another embodiment of the invention the second feature is detected by interactions with the second feature itself. This can be achieved by directing high kinetic energy electrons towards the inspected object. At certain kinetic energy layers enough electrons will interact with the second feature and will be eventually detected. The high kinetic energy can be introduced by subjecting the electrons to strong electrostatic fields.

According to an embodiment of the invention the electrons are accelerated by a high acceleration voltage towards the object. Typically, this acceleration voltage may range between 5 kV to 15 kV, but this is not necessarily so.

It is noted that the second feature can be detected by combining both detection based upon interaction with second feature and monitoring the first layer topography.

According to another aspect of the invention the detection of second feature can involve controlling the penetration depth of the electrons in response to the depth of the second feature. This may involve directing electrons to penetrate through the first layer (and even the intermediate layer) such as to be reflected by the second feature, when such a feature is illuminated by the beam.

According to another embodiment of the invention the scanning of the inspected object charges the second layer that may be detected by implementing capacitance voltage contract methods.

Improving Second Feature Detection by Pre-Charging

According to yet a further embodiment of the invention the detection is further improved by a preliminary step of charging the second feature. This may improve the detection when using either one of the mentioned above detection methods.

It is further noted that overlay measurement errors can utilize both

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Multi Perspective Overlay Measurement

Figure 2B:
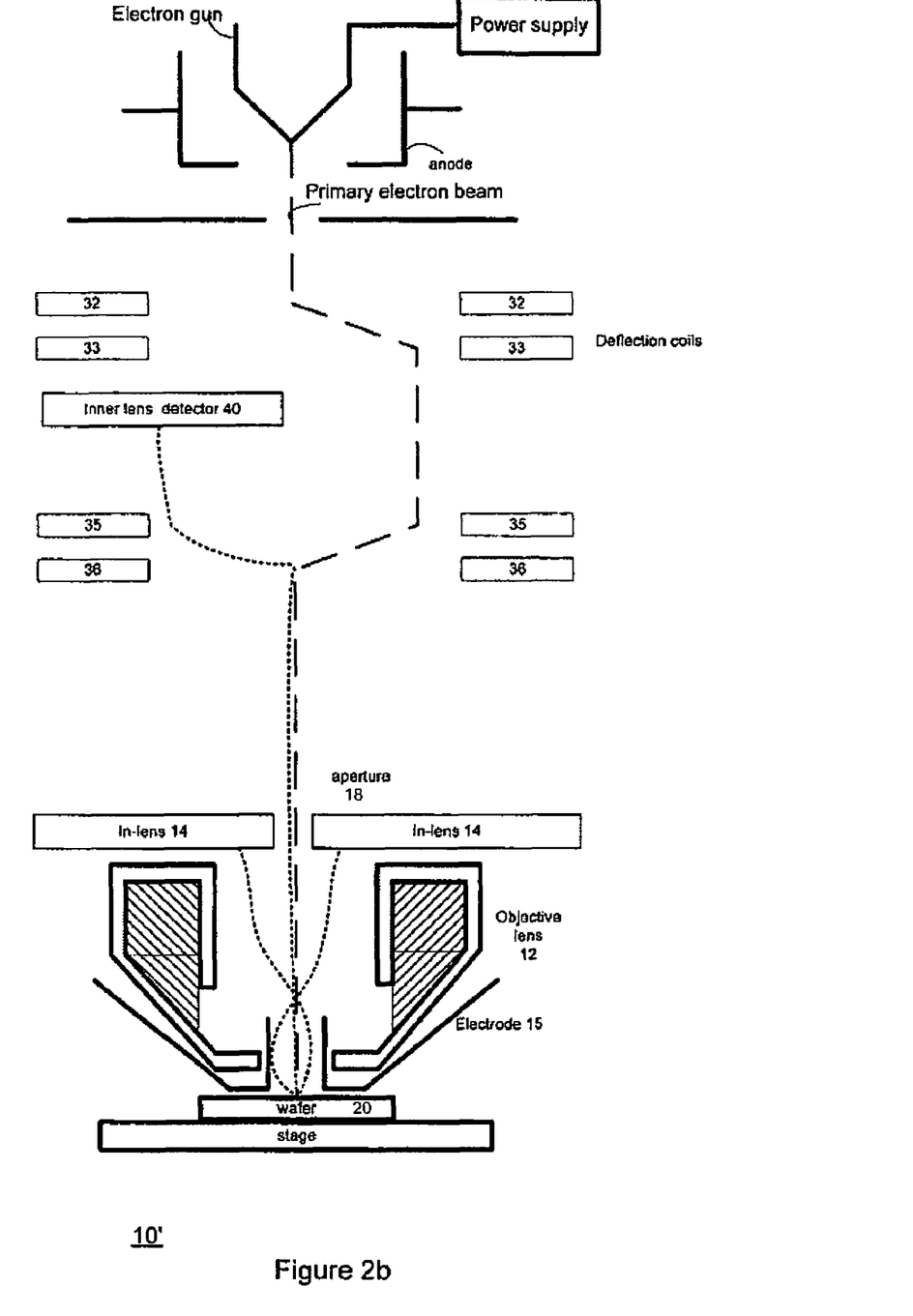
FIG. 2*b* illustrates a portion of another multi-detector SEM.

FIG. 2*b* is an illustration of a portion 10' of multiple-detector SEM in accordance to an embodiment of the invention. FIG. 2*b* also illustrates an exemplary path of a primary electron beam, as well as the paths of electrons that are scattered or reflected from an inspected object, such as but not limited to a wafer or a reticle.

The primary electron beam propagates along an optical axis and is then (i) tilted in a first direction, (ii) tilted in an opposite direction such as to propagate along a secondary optical axis that is parallel to the optical axis but spaced apart from the optical axis, (iii) tilted, in a second direction, towards the optical axis and then (iv) tilted, in a direction opposing the second direction, such as to propagate along the optical axis. The above-mentioned tilt operations may be generated by magnetic deflection coils 32-36. A system and method for double tilt is described at patent application Ser. No. 10/146,218 filed 13 May 2002, and is incorporated herein by reference. The electron beams are subjected to an electrostatic field that can be introduced by multiple electrodes of various shapes and arrangements. Some of the embodiments are illustrated in U.S. patent application Ser. No. 10/423,289 titled "objective lens arrangement for use in a charged particle beam column", that is incorporated herein by reference.

It is noted that other tilt schemes may be implemented, such as performing only the fist two tilts, such that the primary electron beam interacts with the inspected object while propagating along the secondary axis.

In system 10' the primary electron beam is directed through an aperture 18 within the in-lens detector 14 to be focused by the objective lens 12 onto an inspected wafer 20. Secondary electrons that propagate through the aperture of in-lens detector 14 are eventually tilted in a second direction towards an inner-lens detector 40.

The in-lens detector is located at the final part of the propagation path, where the primary electron beam propagates along the optical axis. The in-lens detector has an aperture that is positioned such as to surround the optical axis.

Once electrons are emitted/scattered as a result of an interaction between the primary beam and the inspected object they are attracted, due to a strong electromagnetic field, towards the in-lens detector and to the aperture of that detector. The strength of the electrostatic field determines which secondary electrons are attracted to the in-lens detector and which are attracted to the aperture of the in-lens detector.

Secondary electrons that propagate through the aperture of in-lens detector 14 are eventually tilted in a second direction towards an inner-lens detector 40.

By applying a relatively strong electrostatic field the inner lens detector detects electrons that were once either not detected (passed through the aperture) or detected by the in-lens detector, while the in-lens detector detects electrons that once were detected by the external detectors.

Figure 4A:
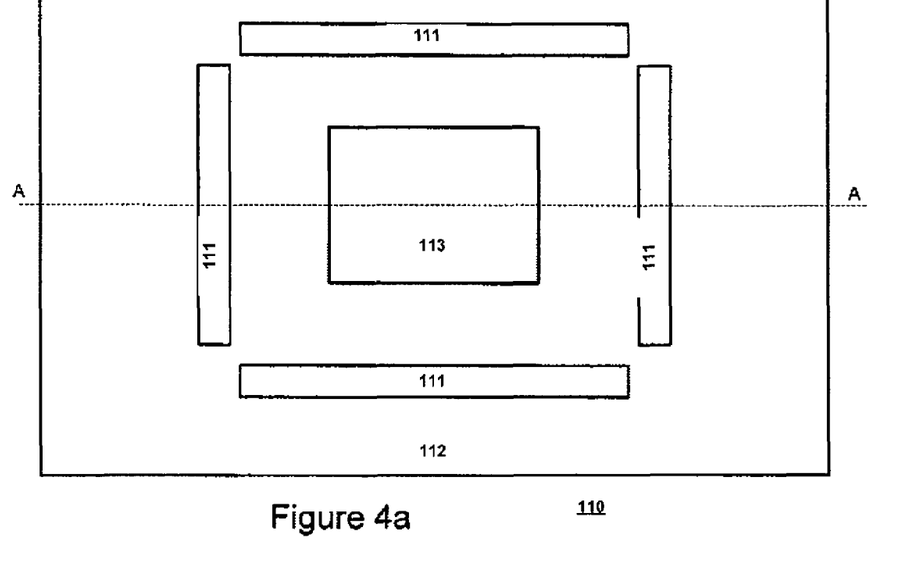
FIGS. 4*a*-4*b* are different view of overlay target.
Figure 4B:
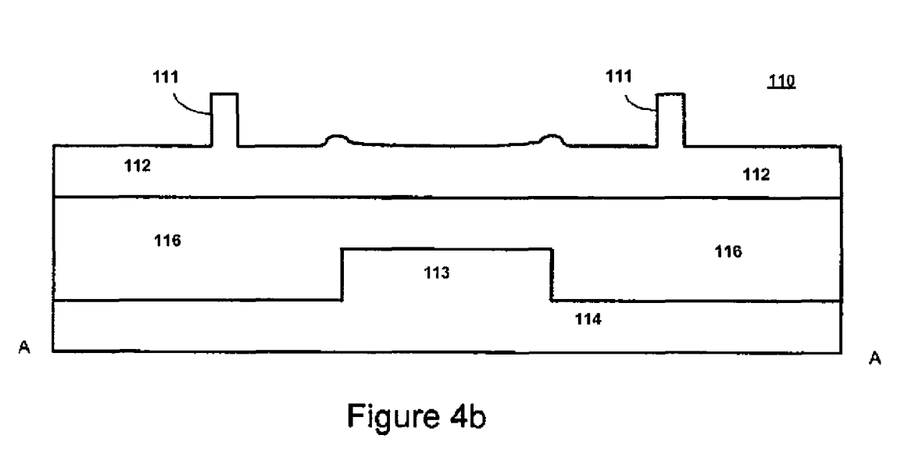

FIGS. 4a and 4b illustrate an overlay measurement target 110 that facilitates overlay measurements. Target 110 differs than prior art target 90 by not having an aperture that exposes the second feature.

When using the invention the size of the overlay target 110 may be about tens of nanometers and even less. Target 110 includes a first feature 111 formed in a first layer 112, a second feature 113 formed in a second layer 114. Target 110 also includes an intermediate layer 116 that is positioned between the first and second layers. While first feature 111 is visible to optical beams, second feature 113 is buried under first and intermediate layers 112 and 116.

The second feature can be detected by detecting its effect upon the topography of the first layer (according to a first embodiment of the invention) and/or by detecting electrons that interact with the second feature itself (according to a second embodiment of the invention). When the detection depends upon interaction with the second feature then the kinetic energy of the electrons is such that the second feature is included within a second information volume, such as the relatively large second information volume 5 of FIG. 1.

The small size of the overlay target enables positioning it within the die, to use multiple targets and even to use die patterns as targets.

Figure 5:
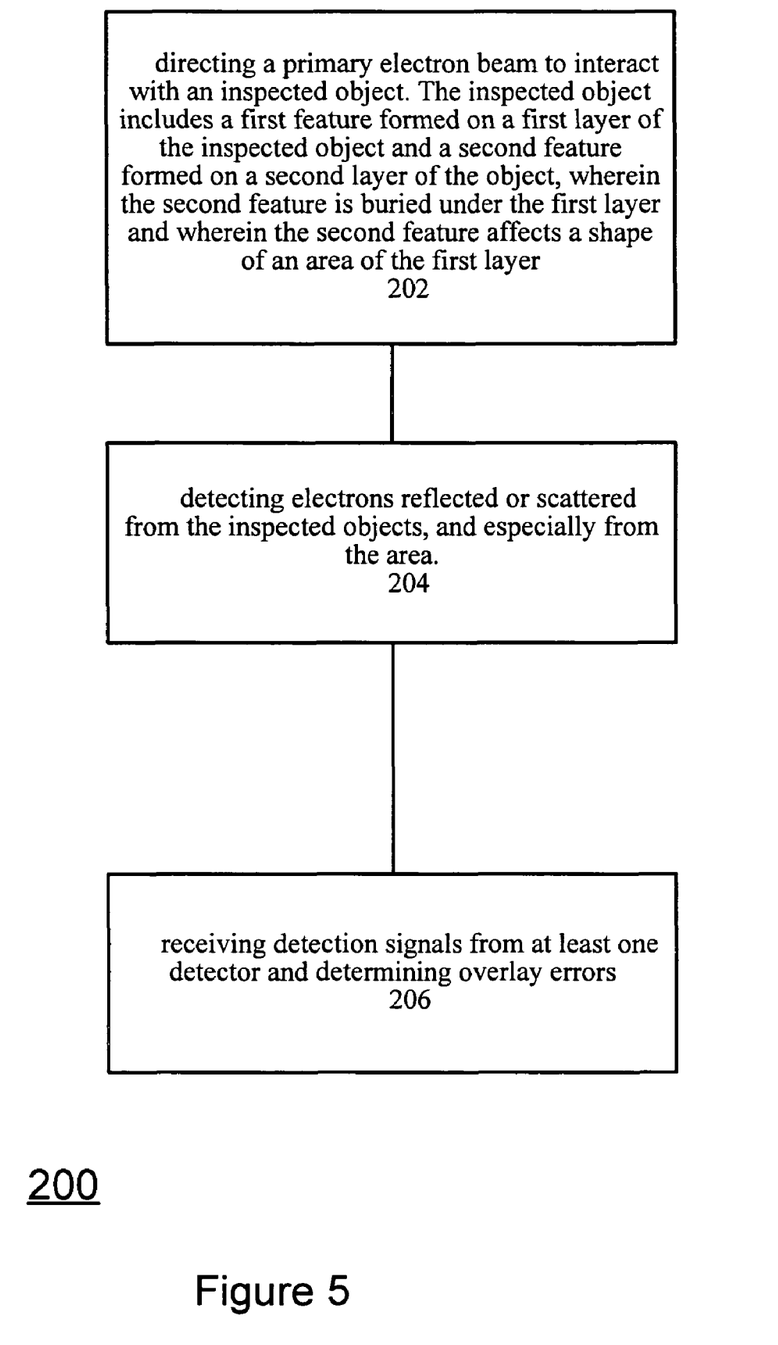
FIGS. 5-6 are flow charts illustrating methods for measuring overlay errors, according to various embodiments of the invention.
Figure 6:
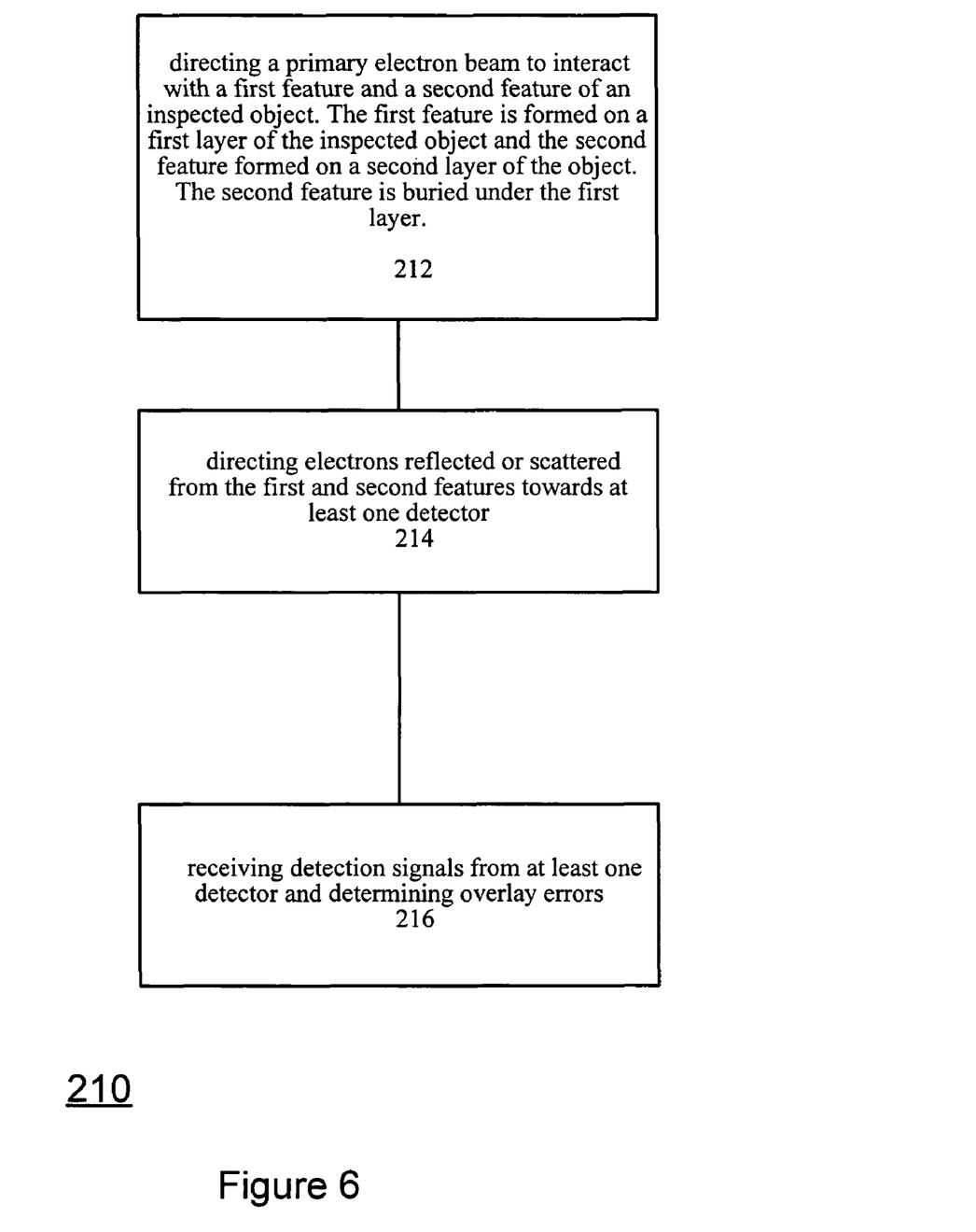

FIGS. 5-7 illustrate methods 200-250 for overlay error detection.

Method 200 starts by step 202 of directing a primary electron beam to interact with an inspected object. The inspected object includes a first feature formed on a first layer of the inspected object and a second feature formed on a second layer of the object, wherein the second feature is buried under the first layer and wherein the second feature affects a shape of an area of the first layer. As illustrated at FIGS. 4a-4b an intermediate layer is usually formed between the first and second layer.

Step 202 is followed by step 204 of detecting electrons reflected or scattered from the inspected objects, and especially from the area.

According to an aspect of the invention at least some of the directed electrons are reflected or scattered at small angle in relation to the inspected object. Secondary electrons may be directed towards external detectors 16 of FIG. 1 or in-lens detector 40 of FIG. 2b by introducing an electrostatic field and/or a magnetic field.

The electrostatic field attracts the secondary electrons emitted from the first layer, and especially from an area of the first layer that is affected by the second feature. Usually, the first layer surface is deformed as a result of the second layer. For example, an ideally planar area of the first layer will include bumps positioned above the second pattern. These bumps are usually much smaller than the first and second feature and cannot be detected by usual top-view inspection. On the other hand, the edges of the bumps can be detected by collecting electrons at small angles in relation to the first layer. In a sense such a detection resembles "dark field" detection schemes that are very sensitive to scattered radiation.

Step 204 is followed by step 206 of receiving detection signals from at least one detector and determining overlay errors. Step 206 usually includes calculating the relative displacement between the first and second features, and comparing the relative displacement to an expected displacement to determine the overlay error.

FIG. 6 illustrates method 210 for detecting overlay errors. Method 210 starts at step 212 of directing a primary electron beam to interact with a first feature and a second feature of an inspected object. The first feature is formed on a first layer of the inspected object and the second feature formed on a second layer of the object. The second feature is buried under the first layer.

Step 212 is followed by step 214 of directing electrons reflected or scattered from the first and second features towards at least one detector. At least some of the directed electrons may be reflected or scattered at small angle in relation to the inspected object, but this is not necessarily so.

Step 214 is followed by step 216 of receiving detection signals from at least one detector and determining overlay errors.

Each of methods 200 and 210 may further include a preliminary step of charging the second layer. This step may include scanning the inspected object with an electron beam.

According to an embodiment of the invention the overlay errors are measured as deviations from a required spatial relationship between the first and second feature.

According to an aspect of the invention measuring buried features, without creating an aperture allows measurement of overlay error by inspecting features of the integrated circuit that were not intended to be overlay measurement targets. A search of the integrated circuit CAD file and/or layout may indicate the presence of non-overlapping first and second features that may be inspected in order to detect overlay errors.

The present invention can be practiced by employing conventional tools, methodology and components. Accordingly, the details of such tools, components and methodology are not set forth herein in detail. In the previous descriptions, numerous specific details are set forth, such as shapes of cross sections of typical lines, amount of deflection units, etc., in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A method for detecting overlay errors, comprising:
directing a primary electron beam to interact with an inspected object, wherein (i) the inspected object has a first feature formed on a first layer, a second feature formed on a second layer, and an intermediate layer positioned between the first layer and the second layer, (ii) the second feature is buried under the first layer, affects a shape of an area of the first layer, and does not overlap with the first feature, and (iii) the area includes a protuberance positioned above the second feature and that is smaller than the first feature, said directing comprising propagating the primary electron beam along an optical axis, diverting the primary electrical beam to propagate along a secondary optical axis that is parallel to but spaced apart from the optical axis, and subsequently diverting the primary electron beam so as to again propagate along the optical axis;
detecting electrons reflected or scattered from the protuberance of the area of the first layer, wherein said electrons are scattered or reflected at angles less than eighty degrees with respect to a surface of the inspected object;
receiving detection signals from a first in-lens detector and a second in-lens detector, the second in-lens detector positioned to detect those of the electrons that pass through an aperture in the first in-lens detector; and
determining the overlay errors according to the detection signals.

2. The method of claim 1 wherein the step of directing further comprises directing electrons of the primary electron beam to interact with the second feature.

3. The method of claim 2 wherein the step of detecting comprises detecting electrons reflected or scattered from the second feature.

4. The method of claim 1 further comprising a preliminary step of charging the second feature.

5. A method for detecting overlay errors, comprising:
directing a primary electron beam to interact with first and second features of an inspected object, wherein (i) said inspected object comprises an intermediate layer positioned between first and second layers, (ii) the first and second features are formed on the first and second layers, respectively, (iii) the second feature is buried under the first layer, and does not overlap with the first feature, and (iv) the first layer includes a protuberance positioned above the second feature and that is smaller than the first feature, said directing comprising propagating the primary electron beam along an optical axis, diverting the primary electrical beam to propagate along a secondary optical axis that is parallel to but spaced apart from the optical axis, and subsequently diverting the primary electron beam so as to again propagate along the optical axis;
detecting electrons reflected or scattered from the protuberance, wherein said electrons are scattered or reflected at angles less than eighty degrees with respect to a surface of the inspected object;
receiving detection signals from a first in-lens detector and a second in-lens detector, the second in-lens detector positioned to detect those of the electrons that pass through an aperture in the first in-lens detector; and
determining the overlay errors according to the detection signals.

6. The method of claim 5 wherein the second feature affects a shape of an area of the first layer.

7. The method of claim 6 wherein the detecting comprises detecting electrons reflected or scattered from the area of the first layer.

8. The method of claim 5 further comprising a preliminary step of charging the second feature.

* * * * *

UNITED STATES PATENT AND TRADEMARK OFFICE
CERTIFICATE OF CORRECTION

PATENT NO.         : 7,842,933 B2
APPLICATION NO.    : 10/691746
DATED              : November 30, 2010
INVENTOR(S)        : Dimitry Shur and Alexander Kadyshevitch It is certified that error appears in the above-identified patent and that said Letters Patent is hereby corrected as shown below:

In the Specification:

Column 2, Line 6: please delete "process" and insert --processes--.

Column 2, Line 8: please delete "process" and insert --processes--.

Column 2, beginning at Line 12: please replace "FIG. 1 illustrates the important interaction processes and various information volumes. An information volume is a space in which interaction processes occur and result in scattering or reflection of electrons that may be eventually detected to provide information about the information volume." with --The figure illustrates a primary electron beam 2 that hits an inspected object 9. As a result, secondary electrons 2 and Auger electrons 4 are emitted from a very thin information volume 3 while back scattered electrons (BSE) 6 and X-ray electrons 8 can leave the inspected object from a relatively large information volume 5 that has a depth that may even exceed one micron.--.

Signed and Sealed this
Twenty-sixth Day of February, 2013

Teresa Stanek Rea
*Acting Director of the United States Patent and Trademark Office*